United States Patent
Tomiyasu

(10) Patent No.: US 8,232,213 B2
(45) Date of Patent: Jul. 31, 2012

(54) SEMICONDUCTOR DEVICE AND MANUFACTURING METHOD THEREOF, AND LIQUID CRYSTAL DISPLAY DEVICE

(75) Inventor: Kazuhide Tomiyasu, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1157 days.

(21) Appl. No.: 11/816,749

(22) PCT Filed: Mar. 9, 2006

(86) PCT No.: PCT/JP2006/304614
§ 371 (c)(1),
(2), (4) Date: Aug. 21, 2007

(87) PCT Pub. No.: WO2006/120796
PCT Pub. Date: Nov. 16, 2006

(65) Prior Publication Data
US 2009/0009705 A1    Jan. 8, 2009

(30) Foreign Application Priority Data

May 11, 2005  (JP) .................................. 2005-139126

(51) Int. Cl.
*H01L 21/302* (2006.01)
*H01L 21/461* (2006.01)
*H01L 21/00* (2006.01)

(52) U.S. Cl. ................. 438/704; 438/108; 257/E23.009

(58) Field of Classification Search .................. 438/152, 438/155, 455, 459, 756, 757, 107, 108, 704; 257/E23.009
See application file for complete search history.

(56) References Cited

U.S. PATENT DOCUMENTS

| | | | |
|---|---|---|---|
| 2002/0027245 A1* | 3/2002 | Noguchi | 257/345 |
| 2002/0030189 A1* | 3/2002 | Ishikawa | 257/59 |
| 2002/0092676 A1* | 7/2002 | Jimarez et al. | 174/262 |
| 2002/0155261 A1* | 10/2002 | Wang et al. | 428/209 |
| 2003/0183876 A1 | 10/2003 | Takafuji et al. | |
| 2004/0061176 A1 | 4/2004 | Takafuji et al. | |

FOREIGN PATENT DOCUMENTS

JP  2004-119636  4/2004
JP  2004-165600  6/2004

OTHER PUBLICATIONS

Bruel et al., "Smart-Cut: A New Silicon on Insulator Material Technology Based on Hydrogen Implantation and Wafer Bonding," Jpn. J. Appl. Phys. vol. 36 (1997), pp. 1636-1641.
International Search Report for PCT/JP2006/304614 mailed Apr. 25, 2006.

* cited by examiner

*Primary Examiner* — Matthew Landau
*Assistant Examiner* — Daniel Luke
(74) *Attorney, Agent, or Firm* — Nixon & Vanderhye P.C.

(57) ABSTRACT

A method for manufacturing a semiconductor device includes: a first etching step of etching a TEOS layer from a glass substrate to partially expose a SiN layer; a second etching step, conducted separately and independently from the first etching step, of wet-etching the exposed SiN layer to partially expose the glass substrate; and a bonding step of bonding a driver portion to the exposed glass substrate.

7 Claims, 7 Drawing Sheets

US 8,232,213 B2

SEMICONDUCTOR DEVICE AND MANUFACTURING METHOD THEREOF, AND LIQUID CRYSTAL DISPLAY DEVICE

This application is the U.S. national phase of International Application No. PCT/JP2006/304614, filed Mar. 9, 2006, which designated the U.S. and claims priority to Japanese Patent Application No. 2005-139126, filed May 11, 2005, the entire contents of each of which are hereby incorporated by reference.

TECHNICAL FIELD

The invention relates to a semiconductor device and a manufacturing method thereof, and a liquid crystal display device having the semiconductor device.

BACKGROUND ART

An SOI (Silicon On Insulator) substrate, a silicon substrate having a monocrystalline silicon layer formed on the surface of an insulating layer, has been known in the art. Reduced parasitic capacitance and increased insulation resistance can be achieved by forming a device such as a transistor on an SOI substrate. In other words, higher device integration and higher device performance can be obtained. The insulating layer is formed from, e.g., a silicon oxide film ($SiO_2$).

For a higher device operating speed and further reduced parasitic capacitance, it is desirable that the SOI substrate have a thinner monocrystalline silicon layer. Therefore, in a known method for fabricating an SOI substrate, a silicon substrate is first bonded to another substrate such as a glass substrate and a part of the silicon substrate is then separated and removed (for example, see Non-patent reference 1).

This method for fabricating an SOI substrate by bonding will be described with reference to FIGS. 11 through 14. Although the thickness of an SOI layer can be reduced by various methods such as those using mechanical polishing, chemical polishing, and porous silicon, a method using hydrogen implantation will be described herein. First, as shown in FIG. 11, a silicon oxide ($SiO_2$) layer 202, an insulating layer, is formed by oxidizing the surface of a silicon substrate 201, a first substrate. Thereafter, as shown in FIG. 12, hydrogen is implanted as a separating material into the silicon substrate 201 through the silicon oxide ($SiO_2$) layer 202 by ion implantation. A hydrogen implantation layer 204 is thus formed as a separation layer at a prescribed depth in the silicon substrate 201. The substrate surface is then cleaned by RCA cleaning or the like. As shown in FIG. 13, a second substrate, for example, a silicon substrate 203, is then bonded to the surface of the silicon oxide layer 202. The following heat treatment produces microcracks at the hydrogen ion implantation depth. As shown in FIG. 14, a part of the silicon substrate 201 is then separated along the hydrogen implanted layer 204. The thickness of the silicon substrate 201 is thus reduced, whereby a silicon layer 201 is formed. It should be noted that, after the separation, the substrate is reduced to a desired thickness by various methods such as polishing and etching, as required, and also, a process of repairing crystal defects resulting from hydrogen implantation, a process of smoothing the silicon surface, and the like are conducted by heat treatment or the like, as required.

An SOI substrate having the $SiO_2$ layer (insulating layer) 202 on the surface of the silicon substrate (second substrate) 203 and having the thin silicon layer 201 on the surface of the $SiO_2$ layer 202 is fabricated in this way.

Non-patent reference 1: Michel Bruel, "Smart-Cut: A New Silicon On Insulator Material Technology Based on Hydrogen Implantation and Wafer Bonding," Jpn. J. Appl. Phys., Vol. 36 (1997), pp. 1636-1641.

DISCLOSURE OF THE INVENTION

Problems to be Solved by the Invention

The inventors found that, by forming a hydrogen implantation layer in a semiconductor substrate and separating a part of the semiconductor substrate, a semiconductor element such as a MOS transistor formed on the semiconductor substrate can be fabricated on another substrate. Therefore, by using a transparent substrate as another substrate, a semiconductor element having a thinner semiconductor layer can be used for a liquid crystal display device.

It is herein assumed that a semiconductor device portion including such a semiconductor element is bonded to a glass substrate. As shown in FIG. 10, a SiON film 111 and a TEOS (Tetraethyl Silicate) layer 112 are commonly sequentially formed on the surface of a glass substrate 101 as a first base coat layer and a second base coat layer, respectively. A TFT (Thin Film Transistor) 102 is formed on the TEOS layer 112. The TFT 102 has a semiconductor layer 103 as an active region, a gate insulating film 104 covering the semiconductor layer, a gate electrode 105 formed on the gate insulating film 104, and an insulating film 106 covering the gate electrode 105.

For example, the semiconductor device portion 120 which is used as a driver for driving the TFT 102 may be bonded to the surface of the insulating film 106. For reliable bonding, however, the surface to which the semiconductor device portion 120 is to be bonded needs to be highly flat. Since flatness of the insulating film 106 is highly affected by quality of the film, reliable bonding is difficult. Moreover, if the difference in level between the top of the semiconductor device portion 120 and the top of the TFT 102 is relatively large, wiring which connects the semiconductor device portion 120 and the TFT 102 is likely to be disconnected.

In order to solve this problem, the glass substrate 101 may be partially exposed and the semiconductor device portion 120 may be bonded to the exposed part of the glass substrate 101. In this case, however, when the insulating film 106, the gate insulating film 104, the TEOS 112, and the SiON film 111 are simultaneously removed from the glass substrate 101 by a wet etching method with an HF-based solution, the surface of the glass substrate 101 is also etched and becomes uneven, making reliable bonding of the semiconductor device portion 120 difficult. Moreover, when these films are removed by a dry etching method, the surface of the glass substrate 101 becomes more uneven, making bonding itself of the semiconductor device portion 120 difficult.

The invention is made in view of the above problems and it is an object of the invention to enable reliable bonding of a semiconductor device portion to an exposed surface of a glass substrate after removing a base coat layer and to reduce the difference in level on the glass substrate.

Means for Solving the Problems

In order to achieve the above object, according to the invention, two etching steps are conducted separately and independently for a glass substrate having a first base coat layer and a second base coat layer sequentially formed thereon. More specifically, the step of etching the second base layer and the step of wet-etching the first base coat layer are sequentially conducted separately and independently.

More specifically, according to the invention, a method for manufacturing a semiconductor device by bonding a semiconductor device portion having a semiconductor element to a glass substrate having a first base coat layer and a second base coat layer sequentially formed thereon, includes: a first etching step of etching the second base coat layer from the glass substrate to partially expose the first base coat layer; a second etching step, conducted separately and independently from the first etching step, of wet-etching the exposed first base coat layer to partially expose the glass substrate; and a bonding step of bonding the semiconductor device portion to the exposed glass substrate.

Preferably, the first base coat layer has a lower etching rate than that of the second base coat layer to a fluorine-containing etchant.

Preferably, in the second etching step, the first base coat layer is etched by a non-fluorine-containing etchant.

The first base coat layer may be a SiN layer. Alternatively, the first base coat layer may be a SiNO layer.

Preferably, the second base coat layer is a TEOS layer.

The semiconductor element of the semiconductor device portion may include a semiconductor layer. The semiconductor layer may be formed by first forming a separation layer by implanting a separating material into a semiconductor substrate by ion implantation, and then separating and removing a part of the semiconductor substrate along the separation layer.

According to the invention, a semiconductor device includes: a glass substrate having a first base coat layer and a second base coat layer sequentially formed thereon; and a semiconductor device portion bonded directly to a region of the glass substrate where the first base coat layer and the second base coat layer have been removed. The first base coat layer has a lower etching rate than that of the second base coat layer to a fluorine-containing etchant.

According to the invention, a liquid crystal display device includes: an active matrix substrate; a counter substrate facing the active matrix substrate; and a liquid crystal layer formed between the active matrix substrate and the counter substrate. The active matrix substrate includes a glass substrate having a first base coat layer and a second base coat layer sequentially formed thereon, and a semiconductor device portion bonded directly to a region of the glass substrate where the first base coat layer and the second base coat layer have been removed. The first base coat layer has a lower etching rate than that of the second base coat layer to a fluorine-containing etchant.

(Effects)

Hereinafter, effects of the invention will be described.

A semiconductor device has a glass substrate, and a first base coat layer is formed on the glass substrate. A second base coat layer is formed on the first base coat layer. In a first etching step, the second base coat layer is etched from the glass substrate so that the first base coat layer is partially exposed. A second etching step is then conducted separately and independently from the first etching step. In the second etching step, the exposed first base coat layer is wet-etched so that the glass substrate is partially exposed. In a bonding step, a semiconductor device portion is bonded to the exposed glass substrate. By these steps, a semiconductor device having a semiconductor device portion bonded directly on the surface of a glass substrate is manufactured.

The first base coat layer has a lower etching rate than that of the second base coat layer to a fluorine-containing etchant. In other words, the etching rate of the base coat layers to this etchant decreases when the first base coat layer has been removed. Preferably, the second base coat layer is formed from a material that is hardly etched by the fluorine-containing etchant. For example, the first base coat layer is preferably a SiN layer or a SiNO layer and the second base coat layer is preferably a TEOS layer. In this case, completion of the first etching step can be easily determined, and etching of the first base coat layer can be started as the second etching step.

In the second etching step, the first base coat layer is etched by using a non-fluorine-containing etchant instead of the above etchant. Since the glass substrate will not be etched by the non-fluorine containing etchant, the surface of the glass substrate will not become uneven. Therefore, the flat surface of the glass substrate can be maintained.

Effects of the Invention

According to the invention, a first etching step and a second etching step are sequentially conducted separately and independently. Therefore, even if an etchant which is used in the first etching step has a property of easily etching a glass substrate, the exposed surface of the glass substrate can be maintained very flat in the second etching step. As a result, a semiconductor device portion can be reliably bonded to the surface of the glass substrate in a bonding step.

DESCRIPTION OF THE REFERENCE NUMERALS

Figure 1:
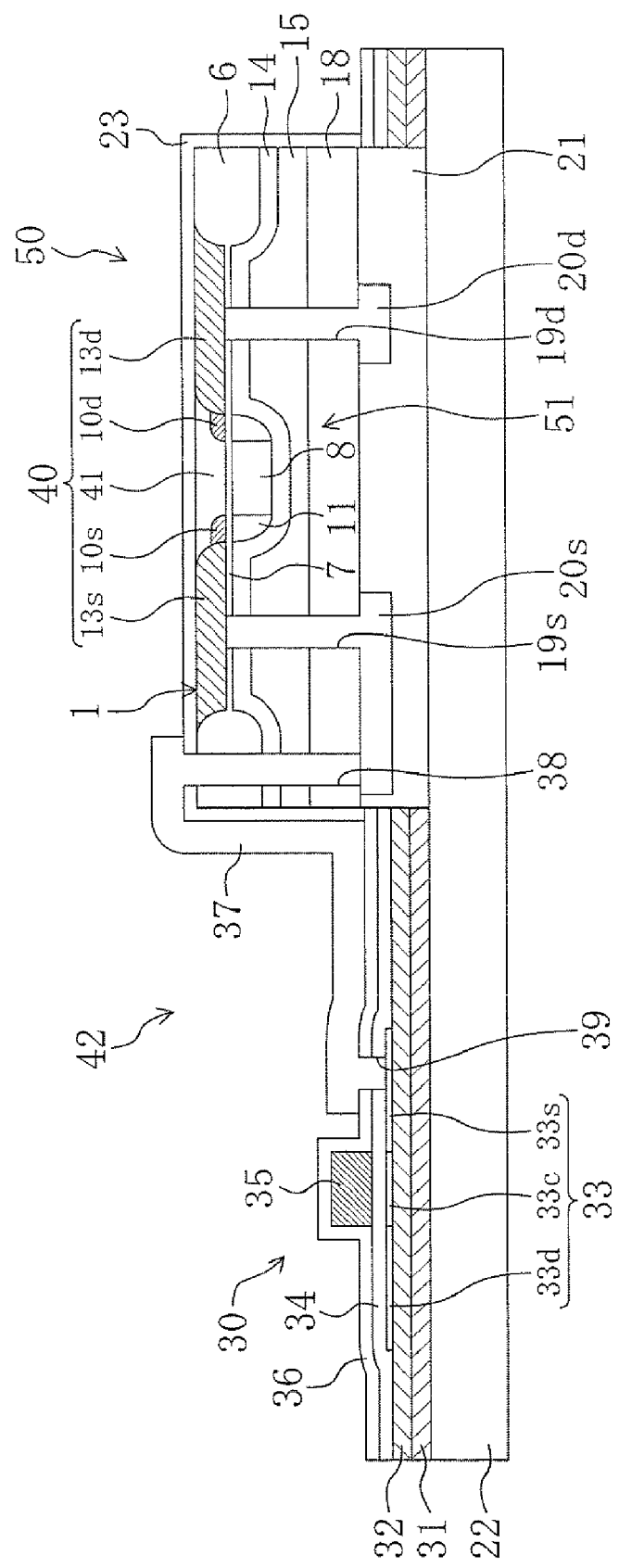
FIG. 1 is a cross-sectional view of a main part of an active matrix substrate of a first embodiment.

S: liquid crystal display device
1: semiconductor layer, semiconductor substrate
17: separation layer
22: glass substrate
31: SiN layer (first base coat layer)
32: TEOS layer (second base coat layer)
42: active matrix substrate (semiconductor device)
43: counter substrate
44: liquid crystal layer
50: driver portion (semiconductor device portion)
51: MOS transistor (semiconductor element)

BEST MODE FOR CARRYING OUT THE INVENTION

Hereinafter, embodiments of the invention will be described in detail with reference to the accompanying drawings. It should be noted that the invention is not limited to the following embodiments.

(First Embodiment)

Figure 7:
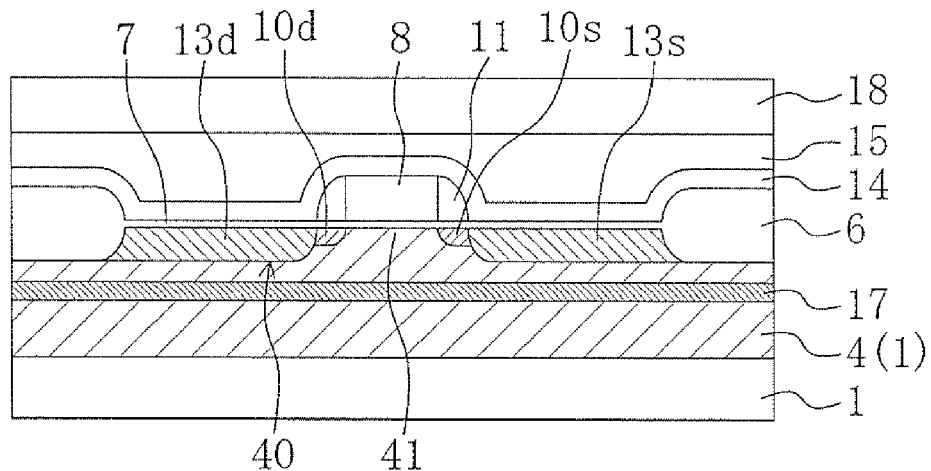
FIG. 7 is a cross-sectional view showing a separation layer formed in the step of forming a separation layer.
Figure 8:
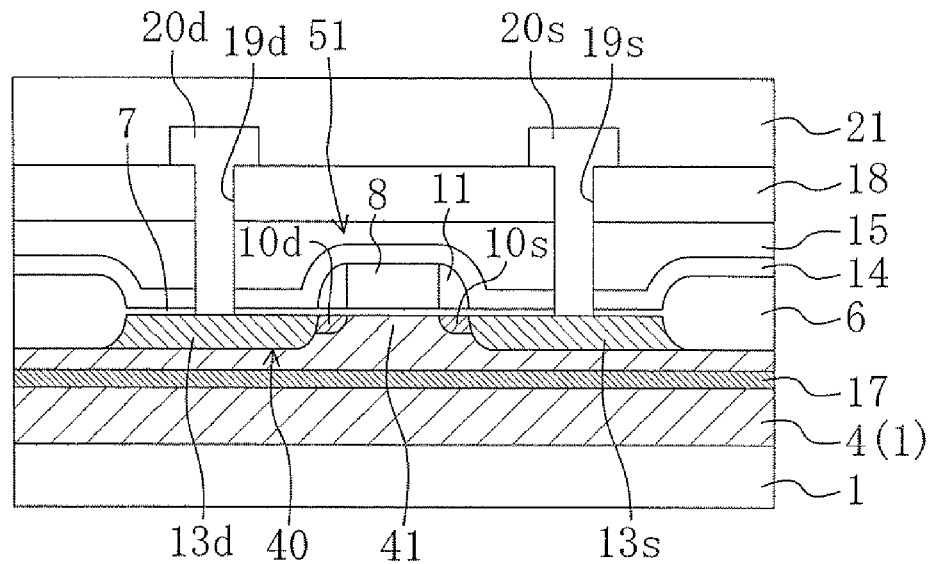
FIG. 8 is a cross-sectional view showing a planarizing film and an electrode which are formed in the step of forming a planarizing film.
Figure 9:
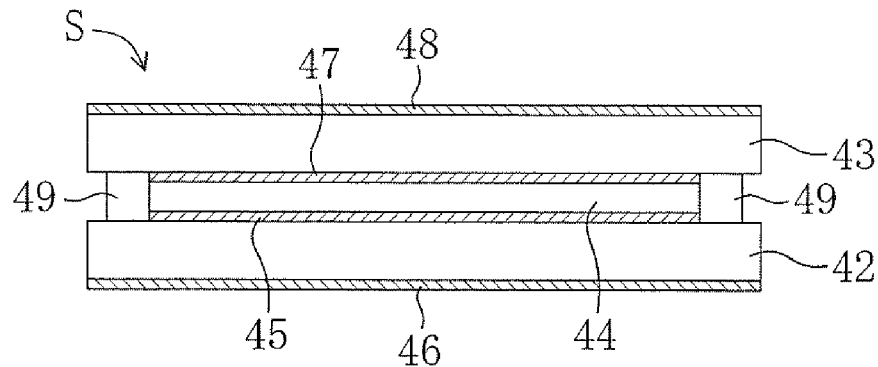
FIG. 9 is a schematic cross-sectional view of a main part of a liquid crystal display device.
Figure 10:
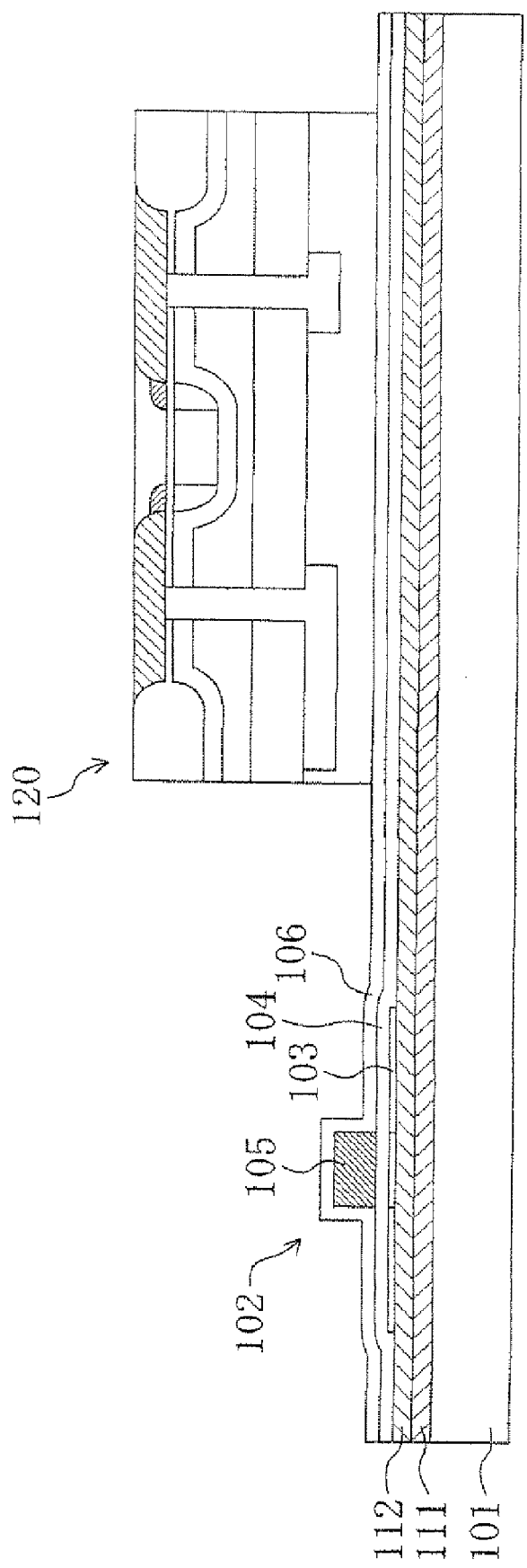
FIG. 10 is a cross-sectional view showing a semiconductor device portion bonded to a glass substrate without removing a base coat layer.
Figure 11:
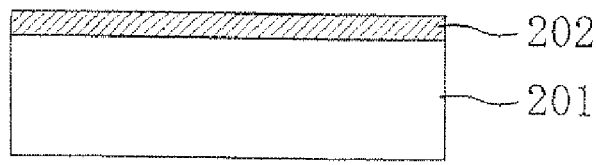
FIG. 11 shows the state in which a silicon oxide film is formed according to a conventional SOI substrate fabricating process.
Figure 12:
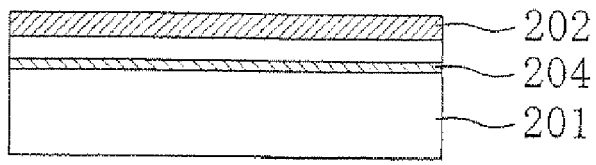
FIG. 12 shows the state in which a hydrogen implantation layer is formed according to the conventional SOI substrate fabricating process.
Figure 13:
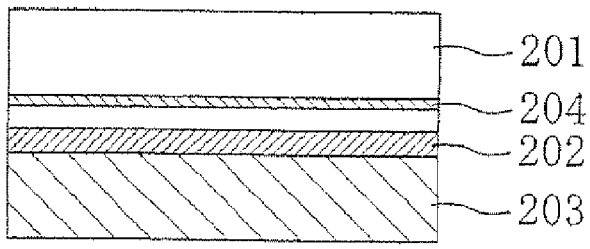
FIG. 13 shows the state in which a substrate is bonded to a glass substrate according to the conventional SOI substrate fabricating process.
Figure 14:
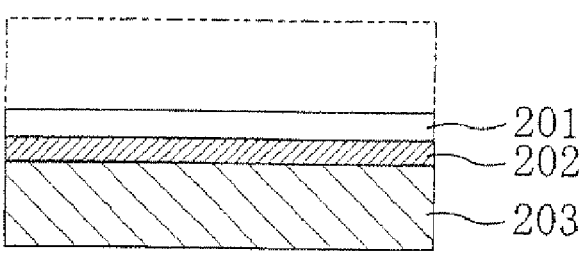
FIG. 14 shows the state in which a part of a silicon layer is separated according to the conventional SOI substrate fabricating process.

FIGS. 1 through 9 show a first embodiment of the invention. FIG. 9 is a schematic cross-sectional view of a main part of a liquid crystal display device (LCD) S. FIG. 1 is an enlarged cross-sectional view of a main part of an active matrix substrate 42. FIGS. 1 through 8 are cross-sectional views illustrating a method for manufacturing an active matrix substrate 42, a semiconductor device, and a driver portion 50, a device portion.

As shown in FIG. 9, the LCD S includes an active matrix substrate 42, a counter substrate 43 facing the active matrix substrate 42, and a liquid crystal layer 44 formed between the substrates 42, 43.

A plurality of pixels (not shown) are formed on the active matrix substrate 42, and a plurality of TFTs (Thin Film Transistors) 30 as shown in FIG. 1 are formed at respective pixels. An alignment film 45 is formed on a surface of the active matrix substrate 42 which faces the liquid crystal layer 44. A polarizing plate 46 is formed on the opposite surface of the active matrix substrate 42, the surface which does not face the liquid crystal layer 44. A driver portion 50 for driving the TFTs 30 is mounted on the active matrix substrate 42.

Although not shown in the figures, elements such as a color filter and a common electrode made from ITO are formed on the counter substrate 43. An alignment film 47 is formed on a surface of the counter substrate 43 which faces the liquid crystal layer 44. A polarizing plate 48 is formed on the opposite surface of the counter substrate 43, the surface which does not face the liquid crystal layer 44. The liquid crystal layer 44 is sealed by a seal member 49 interposed between the active matrix substrate 42 and the counter substrate 43. The LCD S provides desired display by controlling an orientation state of liquid crystal molecules in the liquid crystal layer 44 by the TFTs 30.

The TFTs 30 are formed on the surface of a glass substrate 22, a transparent substrate, with a first base coat layer 31 and a second base coat layer 32 interposed therebetween. The first base coat layer 31 and the second base coat layer 32 are sequentially formed on the surface of the glass substrate 22. The etching rate of the first base coat layer 31 to a fluorine-containing etchant is lower than that of the second base coat layer 32. The more the difference in etching rate between the first and second base coat layers is, the more preferable. It is also preferable that the second base coat layer 32 is not etched by an etchant for etching the first base coat layer. The first base coat layer 31 is formed from, e.g., a SiN layer, and is formed on the surface of the glass substrate 22. The second base coat layer 32 is formed from, e.g., a TEOS layer, and is formed on the surface of the first base coat layer 31.

Note that the first base coat layer 31 may be formed from, e.g., a SiNO layer instead of a SiN layer. This is because the SiNO layer is similar in characteristics to the SiN layer and has a lower etching rate to a fluorine-containing etchant than that of the TEOS layer (the second base coat layer 32). The first base coat layer 31 of the invention is not limited to this, and may be formed from another insulating film whose etching rate to an etchant is lower than that of the second base coat layer 32.

The TFT 30 includes: a semiconductor layer 33 including an active region; a gate insulating film 34 covering the semiconductor layer 33; a gate electrode 35 formed on the gate insulating film 34; and a protective film 36 covering the gate electrode 33. The semiconductor layer 33 has a source region 33s, a drain region 33d, and a channel region 33c formed between the source region 33s and the drain region 33d.

As shown in FIG. 1, the driver portion 50 is formed on the surface of the glass substrate 22 and has a MOS transistor 51, a semiconductor element. An insulating film 21 as a first planarizing film, an interlayer insulating film 18 as a second planarizing film, an interlayer insulating film 15, and an insulating film 14 are sequentially formed on the glass substrate 22 in this order. The insulating film 21 is bonded to the surface of the glass substrate 22.

The surface of the insulating film 14 is recessed toward the glass substrate 22, and a gate oxide film 7 and a LOCOS oxide film 6 are formed on the surface of the insulating film 14. A gate electrode 8 and a sidewall 11 are formed between the gate oxide film 7 and the insulating film 14. The sidewall 11 is formed on both sides of the gate electrode 8.

In the insulating film 21, a source electrode 20s and a drain electrode 20d are formed at the interface with the interlayer insulating film 18. Contact holes 19s, 19d are formed so as to extend through the interlayer insulating film 18, the interlayer insulating film 15, the insulating film 14, and the gate oxide film 7. The contact holes 19s, 19d are filled with an electrically conductive material. The electrically conductive material in the contact hole 19s is formed integral with the source electrode 20s, and the electrically conductive material in the contact hole 19d is formed integral with the drain electrode 20d.

A semiconductor layer 1 is formed on the surface of the gate oxide film 7. The semiconductor layer 1 is a monocrystalline silicon layer. The semiconductor layer 1 is separated from an adjacent semiconductor layer (not shown) by the LOCOS oxide film 6, and is covered by a protective film 23 which is an insulating film. The protective film 23 also covers driver portion 50, including the side surface. The protective film 36 covers the TFT 30.

The semiconductor layer 1 is formed as follows: a separation layer is formed by implanting a separating material into a semiconductor substrate by ion implantation, and a part of the semiconductor substrate is separated and removed along the separation layer. The semiconductor layer 1 is separated on the side of the protective film 36. At least one of hydrogen and an inert gas element can be used as a separating material.

An active region 40 is formed in the semiconductor layer 1. The active region 40 has a channel region 41, low concentration impurity regions 10s, 10d formed on both sides of the channel region 41, and high concentration impurity regions 13s, 13d formed on both sides of the low concentration impurity regions 10s, 10d. N-type impurities such as phosphorus are implanted into the low concentration impurity regions 10s, 10d and the high concentration impurity regions 13s, 13d. The low concentration impurity regions 10s, 10d form a so-called LDD region. The high concentration impurity region 13d forms a source region, and the high concentration impurity region 13d forms a drain region.

The channel region 41 faces the gate electrode 8 with the gate oxide film 7 interposed therebetween. The low concentration impurity regions 10s, 10d face the sidewall 11 with the gate oxide film 7 interposed therebetween. The source electrode 20s is connected to the high concentration impurity region 13s through the contact hole 19s, and the drain electrode 20d is connected to the high concentration impurity region 13d through the contact hole 19d.

The driver portion 50 and the TFT 30 are connected to each other through a wiring portion 37. More specifically, in the driver portion 50, a contact hole 38 is formed on the source electrode 20s so as to extend through the interlayer insulating film 18, the interlayer insulating film 15, the insulating film 14, the LOCOS oxide film 6, and the protective film 36. In the TFT 30, a contact hole 39 is formed on the source region 33s so as to extend through the gate insulating film 34 and the protective film 36. The contact holes 38, 39 are filled with an electrically conductive material, and the wiring portion 37 is patterned on the surface of the protective film 36 so as to connect to both conductive materials in the contact holes 38, 39.

(Manufacturing Method)

Hereinafter, a method for manufacturing the driver portion 50 and the active matrix substrate 42 will be described.

Figure 2:
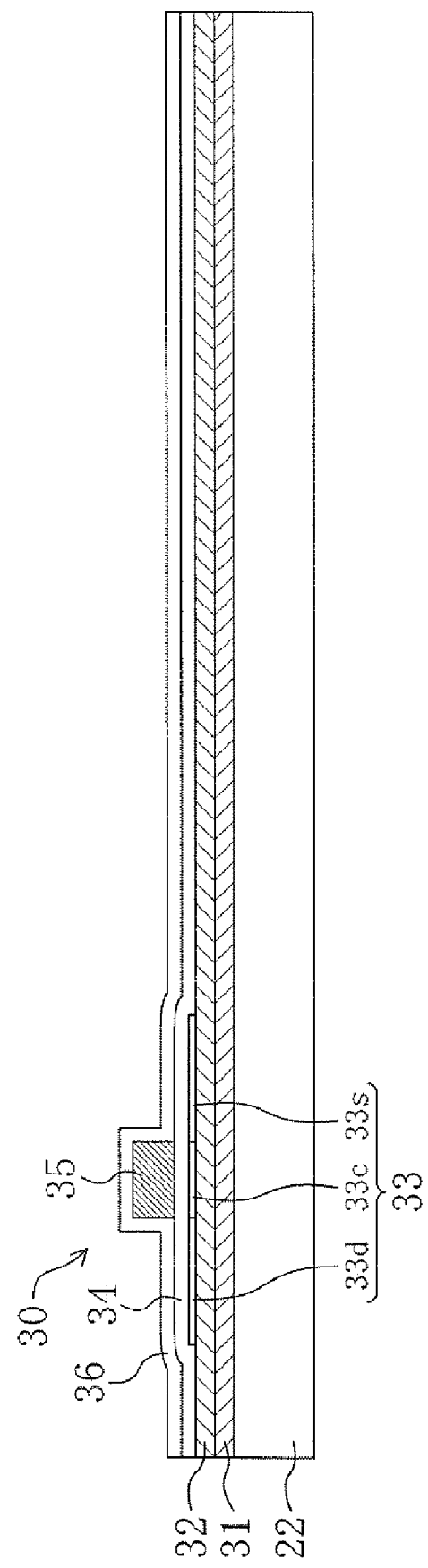
FIG. 2 is a cross-sectional view of a glass substrate with a TFT formed thereon.

First, as shown in FIG. 2, a SiN layer 31 and a TEOS layer 32 are sequentially formed on a glass substrate 22 in this order as base coat layers. A TFT 30 is then formed on the TEOS layer 32 as follows: first, a semiconductor layer 33 is patterned on the surface of the TEOS layer 32 by photolithography. A gate insulating film 34 is then formed on the TEOS layer 32 so as to cover the semiconductor layer 33. Thereafter, a gate electrode 35 is patterned by photolithography so as to extend on a part of the semiconductor layer 33. An impurity element is implanted into the semiconductor layer 33 by ion implantation by using the gate electrode 35 as a mask. The gate electrode 35 is then covered by a protective film 36. The TFT 30 is thus formed on the glass substrate 22.

Thereafter, a first etching step and a second etching step are conducted in order to expose a region of the glass substrate 22 to which a driver portion 50 is to be bonded.

Figure 3:
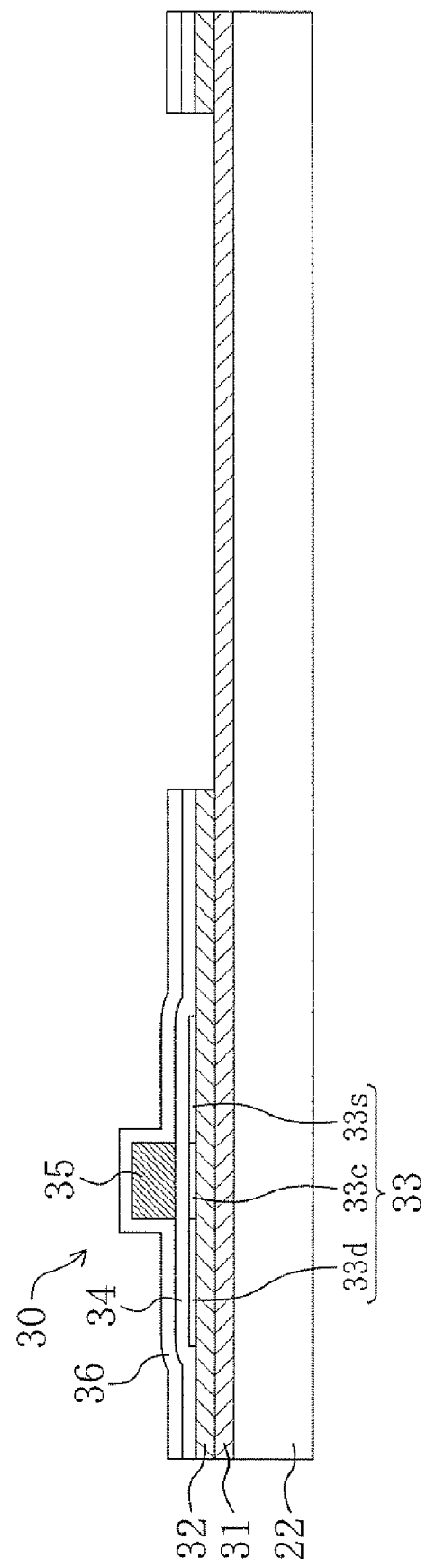
FIG. 3 is a cross-sectional view of a glass substrate after a second base coat layer is etched.

In the first etching step, the SiN layer 31 is partially exposed by etching layers on the glass substrate 22 including the TEOS layer 32. For example, a fluorine-containing etchant such as HF is used for this etching. As shown in FIG. 3, the TEOS layer 32, the gate insulating film 34, and the protective film 36 are etched away in a prescribed region. It should be noted that in the first etching step, dry etching may be used to etch the TEOS layer 32, the gate insulating film 34, and the protective film 36.

In the second etching step, the glass substrate 22 is partially exposed by wet-etching the exposed SiN layer 31. A non-fluorine-containing etchant such as phosphoric acid is used for this etching. Thereafter, in a bonding step, the driver portion 50 is bonded to the exposed glass substrate 22. The active matrix substrate 42 is thus manufactured.

A method for manufacturing the driver portion 50 will now be described. The method for manufacturing the driver portion 50 includes the steps of: forming an oxide film; forming a gate electrode; forming an active region; forming a separation layer; forming a planarizing film; bonding; separating; and forming a protective film.

In the step of forming an oxide film, a P-well region 4 is formed and a LOCOS oxide film 6 and a gate oxide film 7 are formed on a semiconductor substrate 1, a silicon substrate (this semiconductor substrate 1 corresponds to the semiconductor layer 1 before a part of the semiconductor substrate 1 is separated).

Figure 4:
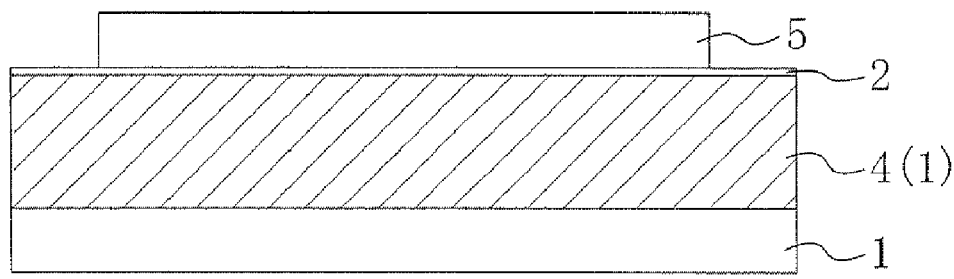
FIG. 4 is a cross-sectional view showing a silicon nitride film formed in the step of forming an oxide film.

More specifically, as shown in FIG. 4, a thermal oxide film 2 is formed on the semiconductor substrate 1, and a P-type impurity element (e.g., boron) is implanted into the semiconductor substrate 1 by ion implantation. Thereafter, the semiconductor substrate 1 is heat-treated so that the implanted P-type impurity element is diffused and activated. The Powell region 4 is thus formed.

Figure 5:
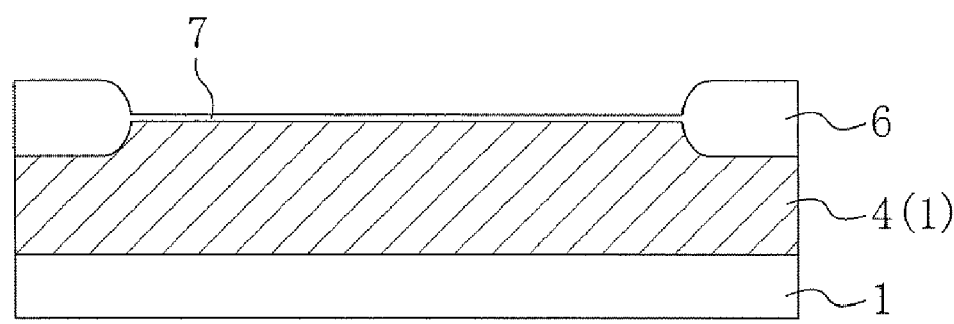
FIG. 5 is a cross-sectional view showing a gate oxide film formed in the step of forming an oxide film.

A silicon nitride film 5 is then patterned on the surface of the thermal oxide film 2. The thermal oxide film 2 and the semiconductor substrate 1 are then subjected to LOCOS oxidation. As a result, a LOCOS oxide film 6 is formed on both sides of the silicon nitride film 5. Thereafter, as shown in FIG. 5, the silicon nitride film 5 and the thermal oxide film 2 are removed, and a gate oxide film 7 is formed in the region where the thermal oxide film 2 used to be.

In the step of forming a gate electrode, an electrically conductive material is formed on the surface of the gate oxide film 7 and is patterned by photolithography or the like. A gate electrode 8 is thus formed on the semiconductor substrate 1 (see FIG. 6).

Figure 6:
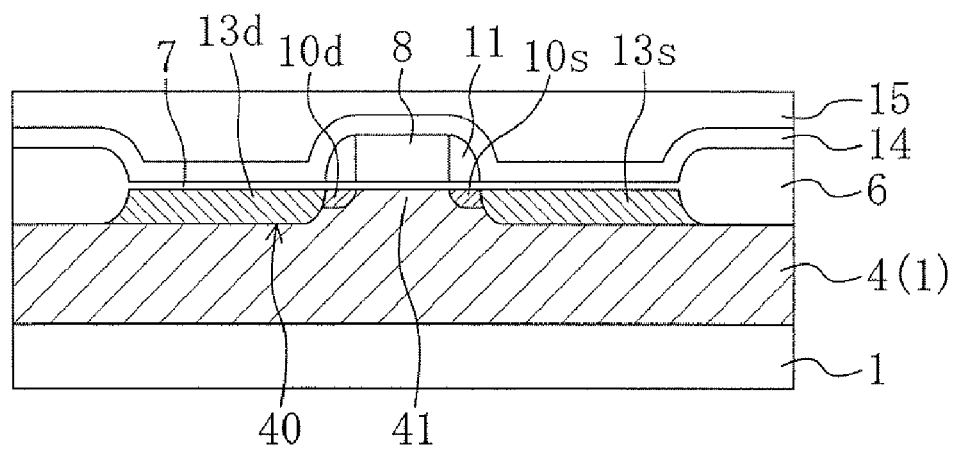
FIG. 6 is a cross-sectional view showing an interlayer insulating film formed in the step of forming a separation layer.

In the step of forming an active region, as shown in FIG. 6, an active region 40 is formed in the P-well region 4 of the semiconductor substrate 1. More specifically, N-type low concentration impurity regions 10s, 10d are first formed by implanting an N-type impurity element such as phosphorus by ion implantation by using the gate electrode 8 as a mask. A $SiO_2$ film is then formed on the surface of the gate oxide film 7 by CVD or the like. The $SiO_2$ film is then etched by anisotropic dry etching, whereby a sidewall 11 is formed on both side walls of the gate electrode 8.

Thereafter, N-type high concentration impurity regions 13s, 13d are formed by implanting an N-type impurity element such as phosphorus by ion implantation by using the gate electrode 8 and the sidewall 11 as a mask. As a result, the low concentration impurity regions 10s, 10d are formed in a region that faces the sidewall 11 with the gate oxide film 7 interposed therebetween. Thereafter, an insulating film 14 such as $SiO_2$ is formed, and the low concentration impurity regions 10s, 10d and the high concentration impurity regions 13s, 13d are heat-treated in order to activate the implanted impurity element.

In the step of forming a separation layer, as shown in FIG. 6, an interlayer insulating film 15 is formed on the surface of the insulating film 14. A separating material formed from an inert gas element such as hydrogen, He, and Ne is implanted into the P-well region of the semiconductor substrate 1 through the interlayer insulating film 15. As shown in FIG. 7, a separation layer 17 containing the separating material is thus formed in the semiconductor substrate 1.

In the step of forming a planarizing film, as shown in FIG. 7, a $SiO_2$ film is formed so as to cover the semiconductor substrate 1 and the interlayer insulating film 15, and then planarized by CMP (Chemical Mechanical Polishing) or the like. An interlayer insulating film 18 is thus formed.

A source electrode 20s and a drain electrode 20d are then formed. More specifically, as shown in FIG. 8, contact holes 19s, 19d are first formed so as to extend through the interlayer insulating film 18, the interlayer insulating film 15, the insulating film 14, and the gate oxide film 7. The contact hole 19s is formed on the high concentration impurity region (source region) 13s, and the contact hole 19d is formed on the high concentration impurity region (drain region) 13d. An electrically conductive material is provided in the contact holes 19s, 19d and on the surface of the interlayer insulating film 18. By patterning the electrically conductive material, the source electrode 20s is formed on the contact hole 19s and the drain electrode 20d is formed on the contact hole 19d. Thereafter, an insulating film 21 is formed, and the surface of the insulating film 21 is planarized by CMP or the like.

In the bonding step, as shown in FIG. 1, the planarized surface of the insulating film 21 is cleaned and then bonded to the surface of the glass substrate 22 which has been exposed by the second etching step.

In the following separating step, heat treatment is conducted at about 400° C. to about 600° C. As a result, as shown in FIG. 1, a part of the semiconductor substrate 1 including the P-well region 4 is separated along the separation layer 17, whereby moving of a MOS transistor 51 of the driver portion 50 onto the glass substrate 22 is completed. Note that, in this embodiment, the semiconductor substrate 1 which has been partially separated in the separating step is referred to as a semiconductor layer 1.

In the step of forming a protective film, after the separation layer 17 is removed by etching or the like, the semiconductor layer 1 is further etched in order to thin the channel region 41 and to expose the LOCOS oxide film 6 for element separation. A protective film 23 is then formed in order to protect the exposed surface of the semiconductor layer 1 and the side surface of the driver portion 50 and to ensure electric insulation.

Thereafter, in the driver portion 50, a contact hole 38 extending through the interlayer insulating film 18, the interlayer insulating film 15, the insulating film 14, the LOCOS oxide film 6, and the protective film 23 is formed on the source electrode 20s. In the TFT 30, a contact hole 39 extending through the gate insulating film 34 and the protective film 36 is formed on the source region 33s. The contact holes 38, 39 are then filled with an electrically conductive material, and a wiring portion 37 is patterned on the surface of the protective films 23, 36 so as to connect to both conductive materials in the contact holes 38, 39. The driver portion 50 is formed on the glass substrate 22 by this procedure. The active matrix substrate 42 is thus manufactured.

(Effects of the First Embodiment)

The TEOS layer 32 as a second base coat layer is preferably etched by a fluorine-containing etchant such as HF in a first etching step. The SiN layer 31 as a first base coat layer 31, on the other hand, is hardly etched by this etchant such as HF. Therefore, completion of the first etching step can be easily determined, and etching of the SiN layer 31 can be started separately and independently as a second etching step.

In the second etching step, the SiN layer 31 is etched by using a non-fluorine-containing etchant such as phosphoric acid instead of the above etchant. Since the glass substrate will not be etched by this etchant such as phosphoric acid, the surface of the glass substrate will not become uneven. Therefore, the flat surface of the glass substrate can be maintained. As a result, the driver portion 50 having a thinner monocrystalline silicon semiconductor layer 1 and a higher-performance MOS transistor 51 can be reliably bonded to the exposed surface of the glass substrate 22 after the base coat layers are removed.

Moreover, the difference in level between the top of the driver portion 50 and the surface of the TFT 20 can be reduced by the total thickness of the SiN layer 31, the TEOS layer 32, the gate insulating film 34, and the protective film 36. Therefore, disconnection of the wiring portion 37 resulting from the difference in level can be suppressed.

When an external driver for driving the TFT 30 is provided to the glass substrate 22, the active matrix substrate 42 has a larger frame region. As a result, the overall size of the LCD is increased. In this embodiment, however, the driver portion 50 can be mounted on the glass substrate 22. Therefore, this problem is solved and the overall size of the LCD can be reduced.

(Other Embodiments)

In the above embodiment, a semiconductor device portion that is bonded to the glass substrate 22 is described as the driver portion 50. However, the invention is not limited to this, and other devices having a flat bonding surface may be used.

INDUSTRIAL APPLICABILITY

As has been described above, the invention is useful for a semiconductor device and a manufacturing method thereof, and a liquid crystal display device. The invention is especially suitable for reliably bonding a semiconductor device portion to an exposed surface of a glass substrate after a base coat layer is removed.

What is claimed is:

1. A method for manufacturing a semiconductor device by bonding a semiconductor device portion having a semiconductor element and a planarized surface to a glass substrate having a first base coat layer and a second base coat layer sequentially formed thereon, comprising:
    a first etching step of dry-etching the second base coat layer from the glass substrate to partially expose the first base coat layer;
    a second etching step, conducted separately and independently from the first etching step, of wet-etching the exposed first base coat layer to partially expose a surface of the glass substrate; and
    a bonding step of bonding the planarized surface of the semiconductor device portion directly to the exposed surface of the glass substrate.

2. The method for manufacturing a semiconductor device according to claim 1, wherein the first base coat layer has a lower etching rate than that of the second base coat layer to a fluorine-containing etchant.

3. The method for manufacturing a semiconductor device according to claim 1, wherein, in the second etching step, the first base coat layer is etched by a non-fluorine-containing etchant.

4. The method for manufacturing a semiconductor device according to claim 1, wherein the first base coat layer is a SiN layer.

5. The method for manufacturing a semiconductor device according to claim 1, wherein the first base coat layer is a SiNO layer.

6. The method for manufacturing a semiconductor device according to claim 1, wherein the second base coat layer is a TEOS layer.

7. The method for manufacturing a semiconductor device according to claim 1, wherein
    the semiconductor element of the semiconductor device portion includes a semiconductor layer, and
    the semiconductor layer is formed by first forming a separation layer by implanting a separating material into a semiconductor substrate by ion implantation, and then separating and removing a part of the semiconductor substrate along the separation layer.

* * * * *